United States Patent
Xiao

(10) Patent No.: US 9,608,115 B2
(45) Date of Patent: Mar. 28, 2017

(54) FINFET HAVING BUFFER LAYER BETWEEN CHANNEL AND SUBSTRATE

(71) Applicant: Semiconductor Manufacturing International (Shanghai) Corporation, Shanghai (CN)

(72) Inventor: Deyuan Xiao, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 15/218,631

(22) Filed: Jul. 25, 2016

(65) Prior Publication Data
US 2016/0336449 A1 Nov. 17, 2016

Related U.S. Application Data

(62) Division of application No. 14/548,736, filed on Nov. 20, 2014, now Pat. No. 9,425,101.

(30) Foreign Application Priority Data

Mar. 4, 2014 (CN) .......................... 2014 1 0077191

(51) Int. Cl.
H01L 29/78 (2006.01)
H01L 27/12 (2006.01)
(Continued)

(52) U.S. Cl.
CPC ...... *H01L 29/7849* (2013.01); *H01L 21/0245* (2013.01); *H01L 21/0262* (2013.01); *H01L 21/02233* (2013.01); *H01L 21/02461* (2013.01); *H01L 21/02463* (2013.01); *H01L 21/02546* (2013.01); *H01L 21/02568* (2013.01); *H01L 21/02636* (2013.01); *H01L 21/308* (2013.01); *H01L 21/3065* (2013.01); *H01L 21/30604* (2013.01); *H01L 21/30608* (2013.01); *H01L 21/823431* (2013.01); *H01L 27/0886* (2013.01); *H01L 27/1211* (2013.01); (Continued)

(58) Field of Classification Search
CPC ............. H01L 29/7851; H01L 27/1211; H01L 29/7853; H01L 29/7854; H01L 29/7849
See application file for complete search history.

(56) References Cited

U.S. PATENT DOCUMENTS 7,075,161 B2 7/2006 Barth
8,234,699 B2 7/2012 Pollutro et al.
(Continued)

*Primary Examiner* — Michael Jung
(74) *Attorney, Agent, or Firm* — Anova Law Group, PLLC

(57) ABSTRACT

FinFET and fabrication method thereof. The FinFET fabrication method includes providing a semiconductor substrate; forming a plurality of trenches in the semiconductor substrate, forming a buffer layer on the semiconductor substrate by filling the trenches and covering the semiconductor substrate, and forming a fin body by etching the buffer layer. The FinFET fabrication method may further includes forming a insulation layer on the buffer layer around the fin body; forming a channel layer on the surface of the fin body; forming a gate structure across the fin body; forming source/drain regions in the channel layer on two sides of the gate structure; and forming an electrode layer on the source/drain regions.

20 Claims, 11 Drawing Sheets

(51) Int. Cl.

| | |
|---|---|
| *H01L 21/02* | (2006.01) |
| *H01L 21/306* | (2006.01) |
| *H01L 21/3065* | (2006.01) |
| *H01L 21/308* | (2006.01) |
| *H01L 21/8234* | (2006.01) |
| *H01L 27/088* | (2006.01) |
| *H01L 29/10* | (2006.01) |
| *H01L 29/267* | (2006.01) |
| *H01L 29/207* | (2006.01) |
| *H01L 29/06* | (2006.01) |
| *H01L 29/201* | (2006.01) |

(52) U.S. Cl.
CPC ...... *H01L 29/0684* (2013.01); *H01L 29/1054* (2013.01); *H01L 29/1079* (2013.01); *H01L 29/1095* (2013.01); *H01L 29/201* (2013.01); *H01L 29/207* (2013.01); *H01L 29/267* (2013.01); *H01L 29/785* (2013.01); *H01L 29/7851* (2013.01); *H01L 29/7853* (2013.01); *H01L 29/7854* (2013.01); *H01L 21/02532* (2013.01)

(56) References Cited

U.S. PATENT DOCUMENTS

| | | | |
|---|---|---|---|
| 2007/0141781 A1* | 6/2007 | Park | H01L 21/28273 438/257 |
| 2009/0095980 A1* | 4/2009 | Yu | H01L 29/66795 257/190 |
| 2009/0206400 A1 | 8/2009 | Juengling | |
| 2013/0099282 A1 | 4/2013 | Chen et al. | |
| 2014/0170839 A1 | 6/2014 | Brunco | |
| 2015/0214370 A1* | 7/2015 | Kim | H01L 29/7853 257/401 |
| 2015/0221769 A1* | 8/2015 | Zhu | H01L 29/785 257/355 |
| 2015/0325646 A1* | 11/2015 | Lai | H01L 29/7851 257/369 |

\* cited by examiner

FINFET HAVING BUFFER LAYER BETWEEN CHANNEL AND SUBSTRATE

CROSS REFERENCE TO RELATED APPLICATIONS

This application is a divisional of U.S. patent application Ser. No. 14/548,736, filed on Nov. 20, 2014, which claims the priority of Chinese patent application no. CN201410077191.1, filed on Mar. 4, 2014, the entire content of all of which is incorporated herein by reference.

FIELD OF THE DISCLOSURE

The present disclosure relates to the field of semiconductor manufacturing technology and, more particularly, relates to a FinFET and a fabrication method thereof.

BACKGROUND

With the rapid development of the semiconductor manufacturing technology, process nodes keep shrinking. Thus, the gate last technique is widely used to obtain an ideal threshold voltage and to improve device performance. However, as the device feature size is further decreasing, the traditional MOSFET structures made by using the gate last technique may no longer satisfy the performance requirement. Thus, multigate device as a substitute to the conventional device draws great attentions. FinFET is a typical multigate device, and is widely used.

Further, as the feature size of the silicon-based device is shrinking, due to restrictions from the silicon material itself, performance of the silicon based device may be unable to be further improved effectively. But by combining certain high performance materials with the silicon, for example, using a layer made of the group III-V materials on the surface of the silicon substrate as a transistor's channel material, the carrier mobility may be enhanced and the driving current may be increased. Thus, performance of the semiconductor device may be further improved. Compared with a FinFET using the silicon material as a channel layer, a FinFET using the group III-V materials as the channel layer may have better performance.

However, because the group III-V materials may have significantly different lattice from the silicon substrate, the group III-V materials layer formed directly on the silicon substrate using an epitaxy process may have a significant high defect density. Thus, the performance of the formed FinFET may be impacted. The disclosed methods are directed to solve one or more problems set forth above and other problems.

BRIEF SUMMARY OF THE DISCLOSURE

One aspect of the present disclosure provides a FinFET fabrication method. An exemplary FinFET fabrication process may include providing a semiconductor substrate; forming one or more trenches in the semiconductor substrate; forming a buffer layer on the semiconductor substrate, wherein the buffer layer may fill the trenches and may cover the surface of the semiconductor substrate; and forming an insulation layer having a top surface lower than the top surface of the fin body on the buffer layer around the fin body.

The exemplary FinFET fabrication process may further include forming a channel layer on the fin body; forming a gate structure across the fin body on portion surface of the insulation layer and the channel layer; forming source/drain regions in the channel layer on two sides of the gate structure, and forming an electrode layer on the surface of the source/drain regions.

Another aspect of the present disclosure provides a FinFET may be made using the disclosed FinFET fabrication method. The FinFET may include a semiconductor substrate having one or more trenches; a buffer layer located on the semiconductor substrate filling the trenches and covering the surface of the semiconductor substrate; a fin body located on the buffer layer; and an insulation layer located on the first buffer layer around the fin body, having a top surface lower than the top surface of the fin body.

The FinFET may further include a channel layer located on the fin body; a gate structure formed across the fin body located on portion surface of the insulation layer and the channel layer; source/drain regions located in the channel layer on two sides of the gate structure, and an electrode layer located on the surface of the source/drain regions.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the invention, which are illustrated in the accompanying drawings. Hereinafter, embodiments consistent with the disclosure will be described with reference to drawings. Wherever possible, the same reference numbers will be used throughout the drawings to refer to the same or like parts. It is apparent that the described embodiments are some but not all of the embodiments of the present invention. Based on the disclosed embodiment, persons of ordinary skill in the art may derive other embodiments consistent with the present disclosure, all of which are within the scope of the present invention.

As illustrated in the background section, because the lattice constants of the group III-V materials may be significantly different with that of the silicon substrate, the epitaxial III-V materials layer formed on the silicon substrate by current techniques may have many defects. Thus, when using the epitaxial layer as a channel layer to form a FinFET, the performance of the finally formed FinFET may be impacted.

Before forming an epitaxial channel layer, a buffer layer may be formed on the silicon substrate first. Then, the epitaxial channel layer may be formed on the buffer layer. The buffer layer may be made of a material having a lattice constant between the silicon substrate and the epitaxial channel layer. Thus, the lattice constant difference between adjacent layers may be reduced. The defects in the buffer layer may be significantly reduced, and the defects in the channel layer formed on the buffer layer by an epitaxy process may also be significantly reduced. However, the buffer layer and the silicon substrate may still have a lattice constant difference, and the defects in the buffer layer may transfer to the channel layer during the epitaxy process. Thus, forming the buffer layer on the silicon substrate and forming the channel layer on the buffer layer may reduce the amount of defects, but the effect may be limited.

To improve this limitation, a plurality of trenches are formed in a semiconductor substrate first. Then, a buffer layer is formed on the semiconductor substrate. The buffer layer may fill the trenches and may cover the surface of the semiconductor substrate. Thus, the defects in the buffer layer may be further reduced. Next, a fin body is formed by etching the buffer layer by a certain thickness. Thus, the surface of the fin body may have significantly fewer defects. When forming a channel layer on the surface of the fin body, the defects in the channel layer may be further reduced. Thus, the finally formed FinFET may have an enhanced performance.

Figure 20:
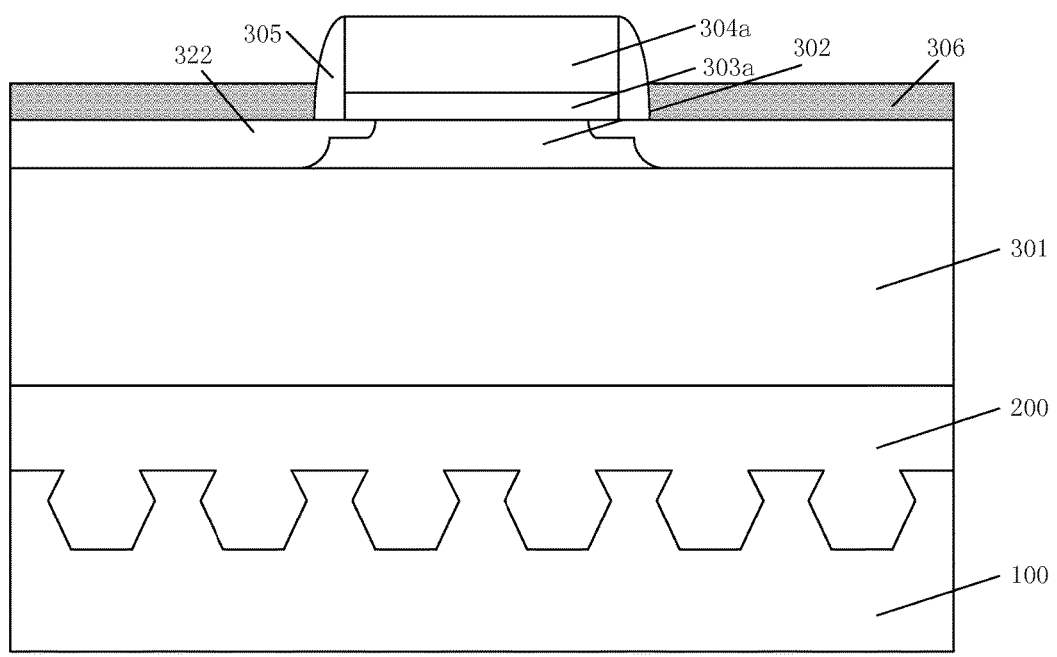
Figure 21:
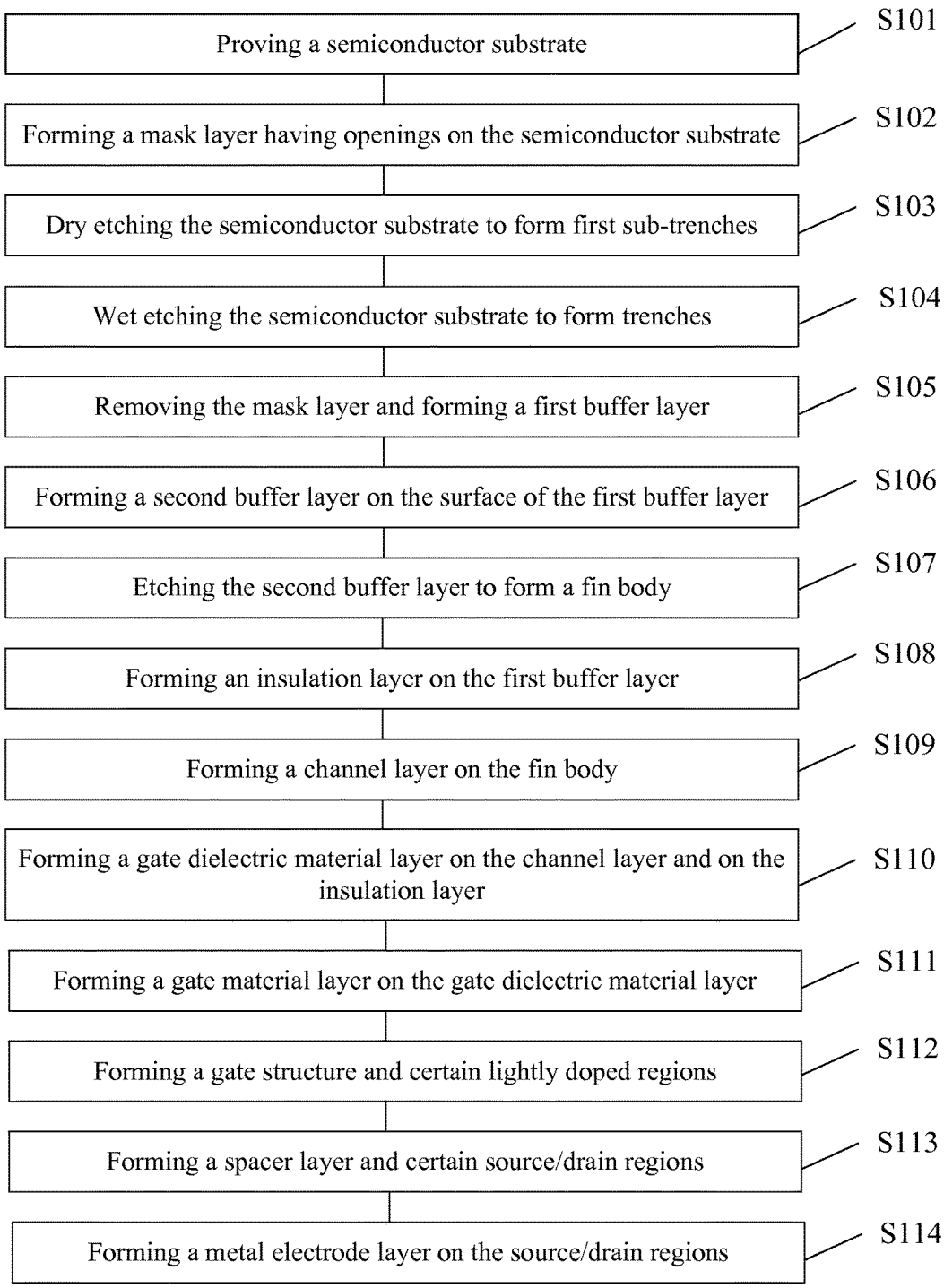
FIG. 21 illustrates a flow chart of an exemplary FinFET fabrication method consistent with the disclosed embodiments.

An exemplary FinFET fabrication method is illustrated in detail below. FIG. 21 illustrates a flow chart of an exemplary FinFET fabrication method consistent with the disclosed embodiments. FIGS. 1-20 illustrate structures of an exemplary FinFET corresponding to certain stages of the fabrication process consistent with the disclosed embodiments.

Figure 1:
FIGS. 1-20 illustrate structures of an exemplary FinFET corresponding to certain stages of a fabrication process consistent with the disclosed embodiments.

As shown in FIG. 21, at the beginning of the FinFET fabrication process, a semiconductor substrate is provided (S101). FIG. 1 illustrates structures of an exemplary FinFET corresponding to certain stages of the fabrication process consistent with the disclosed embodiments.

As shown in FIG. 1, a semiconductor substrate 100 is provided.

The semiconductor substrate 100 may be made of any appropriate semiconductor materials, such as silicon, germanium, gallium arsenidie, silicon germanium, carborundum, indium antimonide, lead telluride, indium arsenide, indium phosphide, gallium antimonite, alloy semiconductor, etc. The semiconductor substrate 100 may also be made of any appropriated composite materials, such as silicon on insulator (SOI), germanium on insulator (GOI), etc. Further, the semiconductor substrate 100 may also be made of any appropriate dielectric materials or insulation materials, such as silicon oxide, silicon nitride, silicon oxynitride, or silicon carbonitride, etc. In one embodiment, the substrate may be made of silicon.

Figure 2:
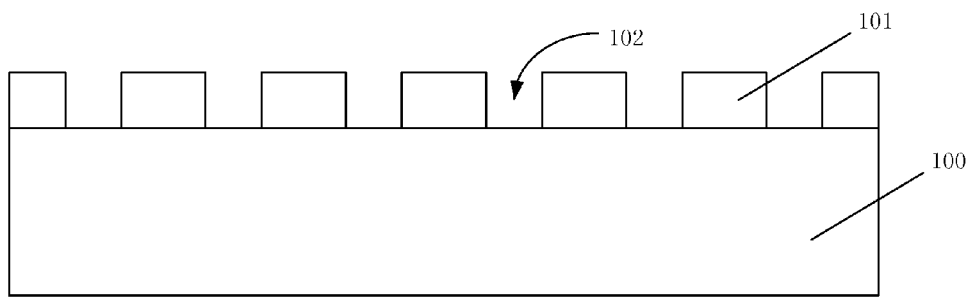

Returning to FIG. 21, a mask layer having one or more openings is formed on the semiconductor substrate (S102). FIG. 2 illustrates structures of an exemplary FinFET corresponding to certain stages of the fabrication process consistent with the disclosed embodiments.

As shown in FIG. 2, a mask layer 101 having one or more opening 102 is formed on the semiconductor substrate 100.

The mask layer 101 may be made of any appropriate materials, such as photoresist, silicon oxide, silicon nitride, etc. In one embodiment, the mask layer 101 may be made of the silicon oxide.

More specifically, the process for forming the mask layer 101 may include forming a mask material layer on the semiconductor substrate 100; forming a photoresist layer on the mask material layer; performing a photolithography process to form a patterned photoresist layer; etching the mask material layer using the patterned photoresist layer as a mask to form the opening 102 in the mask material layer. The formed opening 102 may expose portion surface of the semiconductor substrate 100.

Figure 3:
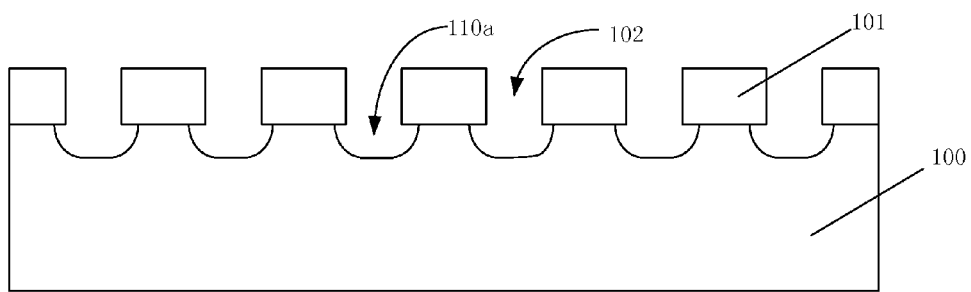

Returning to FIG. 21, a plurality of first sub-trenches are formed in the semiconductor substrate by performing a dry etching process (S103). FIG. 3 illustrates structures of an exemplary FinFET corresponding to certain stages of the fabrication process consistent with the disclosed embodiments.

As shown in FIG. 3, one or more first sub-trench 110a is formed by drying etching the semiconductor substrate 100 for a first time through the opening 102.

More specifically, the dry etching process may use an etching gas made of HBr and $Cl_2$, and a buffer gas made of $O_2$. The flow rate of the HBr may range from 50 sccm to 1000 sccm, the flow rate of the $Cl_2$ may range from 50 sccm to 1000 sccm, and the flow rate of the $O_2$ may range from 5 sccm to 20 sccm. Further, the dry etching process may use a pressure ranging from 5 mTorr to 50 mTorr, a power ranging from 20 W to 750 W, a temperature ranging from 40° C. to 80° C., and an offset voltage ranging from 10 V to 250 V. In one embodiment, the first sub-trench 110a may have arch shaped sidewalls. In other embodiments, the first sub-trench 110a may have inclined or vertical sidewalls by adjusting the dry etching process (e.g. adjusting the etching gas and/or the etching parameters). The etching gas may also be made of other proper gases (e.g. gases containing fluorine).

Figure 4:
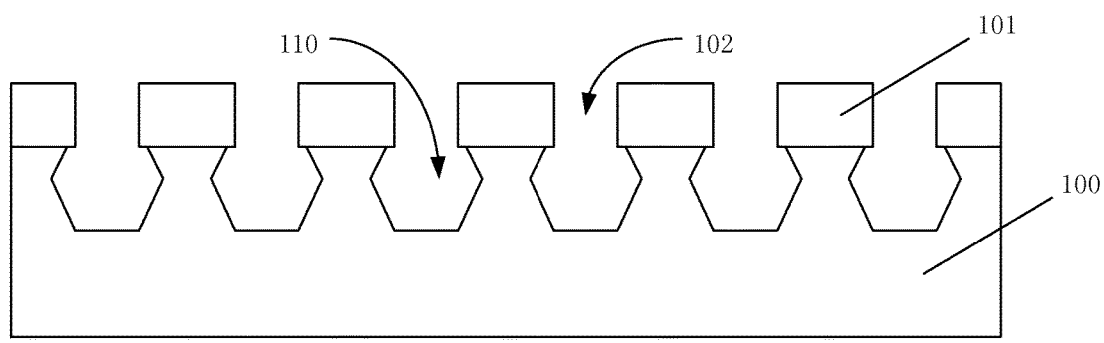

Returning to FIG. 21, a plurality of trenches are formed in the semiconductor substrate by perform a wet etching process (S104). FIG. 4 illustrates structures of an exemplary FinFET corresponding to certain stages of the fabrication process consistent with the disclosed embodiments.

As shown in FIG. 4, one or more trench 110 is formed by performing a wet etching process to etch the semiconductor substrate 100 for a second time.

More specifically, the semiconductor substrate 100 may be etched for the second time along the first sub-trench 110a. The etching solution for the wet etching process may be made of tetramethylammonium hydroxide (TMAH) solution. The wet etching process may use a temperature ranging from 30° C. to 80° C. Further, the wet etching process may be an anisotropic etching process. The semiconductor substrate 100 may have different etching speeds along different crystal orientations. Thus, the formed trench 110 may have "Σ" shaped sidewalls. In other embodiments, the wet etching process may use other etching solutions (e.g. KOH or $HNO_3$).

Further, in other embodiments, only the first etching process (dry etching process) may be performed. The formed first sub-trench 110a (FIG. 3) after the first etching process may be used as the trench 110. Similarly, only the second etching process (wet etching process) may be performed to form the trench.

In addition, the top width of the trench 110 may range from 5 nm to 500 nm. Thus, when depositing a first buffer layer in the trench 110 subsequently, the deposition gas may get into the trench 110 more easily. The formed first buffer layer in the trench 110 may have higher quality.

Moreover, the depth of the trench 110 may range from 8 nm to 1000 nm. Thus, the trench 110 may have relatively smaller depth to width ratio. When depositing the first buffer layer in the trench 110, voids or other defects may not generate in the first buffer layer.

Further, the distance between the adjacent trenches 110 may range from 10 nm to 1000 nm. Thus, more trenches 110 may be formed in the semiconductor substrate 100 to further reduce the defects in the first buffer layer formed subsequently.

Figure 5:
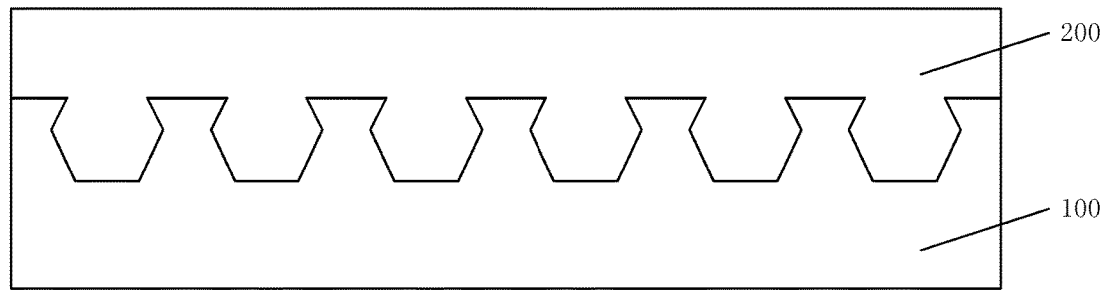

Returning to FIG. 21, a first buffer layer is formed after removing the mask layer (S105). FIG. 5 illustrates structures of an exemplary FinFET corresponding to certain stages of the fabrication process consistent with the disclosed embodiments.

As shown in FIG. 5, a first buffer layer 200 is formed after removing the mask layer 101 (FIG. 4). The first buffer layer 200 may fill the trench 110 (FIG. 4) and may cover the surface of the semiconductor substrate 100.

More specifically, the mask layer may be removed by a wet etching process. The etching solution of the wet etching process may be HF solution. After removing the mask layer 101, the surface of the semiconductor substrate 100 may be exposed. Then, the first buffer layer 200 may be formed on the surface of the semiconductor substrate 100 using an epitaxy process.

In one embodiment, the first buffer layer 200 may be formed by a chemical vapor deposition process. The first buffer layer 200 may be made of silicon germanium. The chemical vapor deposition process may use a reaction temperature ranging from 600° C. to 1100° C., a pressure ranging from 1 Torr to 500 Torr, a silicon source gas $SiH_4$ and/or $SiH_2Cl_2$, a germanium source gas $GeH_4$, and a buffer gas $H_2$. Further, the flow rate of the silicon source gas may range from 0.1 slm to 50 slm, the flow rate of the germanium source gas may range from 0.1 slm to 50 slm, and the flow rate of the hydrogen gas may range from 0.1 slm to 50 slm.

The first buffer layer 200 may have a lattice constant larger than that of the semiconductor substrate 100. In other embodiments, the first buffer layer 200 may be made of other semiconductor materials have a lattice constant smaller than the semiconductor substrate 100.

Further, during the epitaxy process, the first buffer layer 200 may grow alone the surface of the trench 110 (FIG. 4) and along the surface the semiconductor substrate 100. Because the semiconductor substrate 100 may have one or more trench 110, and the trench 110 may further have sidewalls and bottom, the first buffer layer 200 may grow along the surfaces of the trench sidewalls and bottom. Thus, the first buffer layer 200 may have both a horizontal growth component and a vertical growth component.

In addition, the lattice constant of the first buffer layer 200 may be different with that of the of the semiconductor substrate 100. Thus, defects may be generated during the first buffer layer 200 growing process. One of the most obvious defects is the dislocation defect. Further, the first buffer layer 200 growing along different directions may have different dislocation defects pointing to different directions. In the trench 110, as the thickness of the first buffer layer 200 increasing, the first buffer layer 200 growing along different directions may become closed. Thus, the dislocation defects corresponding to different directions in the first buffer layer 200 growing along different directions may compensate or cancel each other, reducing the number of the defects. Further, as the thickness of the closed first buffer layer 200 growing along different directions increasing, the number of the defects may also be reduced gradually.

In one embodiment, the trench 110 may have an Σ shaped profile. This profile may make the trench 110 have more sidewall surfaces facing different directions. Thus, the first buffer layer 200 in the trench 110 may have more different growing directions. The defects in the first buffer layer 200 may be further reduced.

Moreover, the trench 110 may divide the semiconductor substrate 100 into different regions. Thus, atom migrations in the first buffer layer 200 may be interrupted at the trench 110 location. The defects in the first buffer layer 200 may be prevented from transferring to other locations. As the thickness of the first buffer layer 200 growing in the trench 110 increases and is closed with the first buffer layer 200 growing on the surface of the semiconductor substrate 100, defects in the first buffer layer 200 growing on the surface of the semiconductor substrate 100 may be removed. Thus, the finally formed first buffer layer 200 may have improved deposition quality. The surface of the first buffer layer 200 may have fewer defects. Thereby, a second buffer layer formed on the first buffer layer 200 subsequently may have significantly better quality.

Further, the thickness of the first buffer layer 200 located on the surface of the semiconductor substrate 100 may range from 10 nm to 500 nm.

Figure 6:
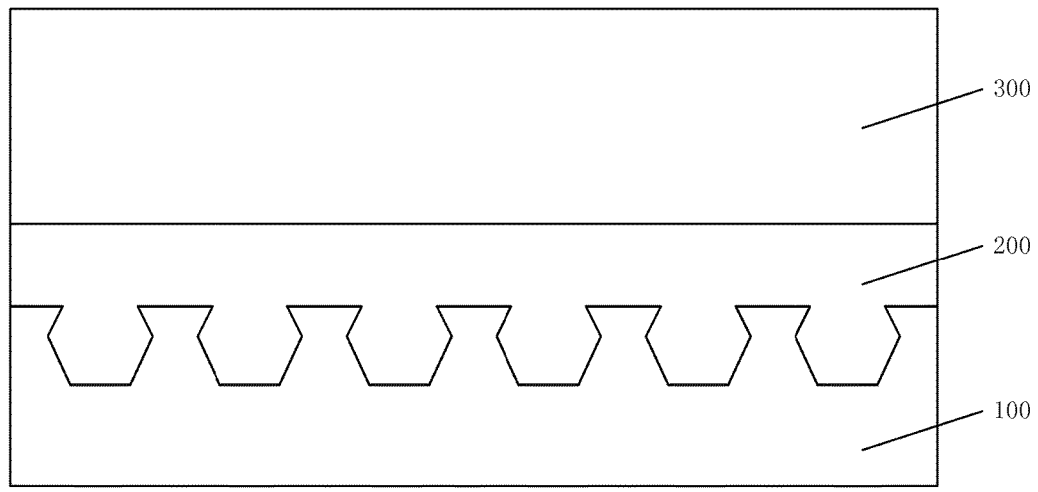

Returning to FIG. 21, a second buffer layer is formed on the surface of the first buffer layer (S106). FIG. 6 illustrates structures of an exemplary FinFET corresponding to certain stages of the fabrication process consistent with the disclosed embodiments.

As shown in FIG. 6, a second buffer layer 300 is formed on the surface of the first buffer layer 200.

More specifically, the second buffer layer 300 may be made of a semiconductor material having a lattice constant larger than that of the first buffer layer 200, such as indium aluminum arsenide compound or indium phosphide. Further, the second buffer layer 300 may be formed by an epitaxy process, including metal oxide chemical vapor deposition and/or molecular beam epitaxy. In one embodiment, the second buffer layer 300 may be made of the indium aluminum arsenide compound using the molecular beam epitaxy process.

The second buffer layer 300 may be used for forming a fin body. After forming the first buffer layer 200 on the surface of the semiconductor substrate 100, the second buffer layer 300 is formed on the surface of the first buffer layer 200. The second buffer layer 300 may have a lattice constant more close to a channel layer, thus, may reduce the defects quantity in the channel layer during the channel layer formation process.

In addition, the lattice constants of the semiconductor substrate 100, the first buffer layer 200, and the second buffer layer 300 may increase gradually. The first buffer layer 200 may work as a transition layer between the semiconductor substrate 100 and the second buffer layer 300. The lattice constant of the second buffer layer 300 may have a relative smaller difference with the first buffer layer 200. Thus, the quality of the second buffer layer 300 may be improved, and the defects in the second buffer layer 300 may be reduced. The finally formed FinFET may have enhanced performance.

In one embodiment, the subsequently formed channel layer may have a lattice constant larger than that of the semiconductor substrate 100. Thus, the lattice constant of the semiconductor substrate 100, the first buffer layer 200, and the second buffer layer 300 may increase gradually to approach the lattice constant of the channel layer. In other embodiments, the subsequently formed channel layer may have a lattice constant smaller than that of the semiconductor substrate 100. Thus, the lattice constants of the semiconductor substrate 100, the first buffer layer 200, and the second buffer layer 300 may decrease gradually to approach the lattice constant of the channel layer.

In one embodiment, the thickness of the second buffer layer 300 may range from 10 nm to 500 nm. In other embodiments, the formed first buffer layer or the second buffer layer alone may work as a final buffer layer. Then, the fin body may be formed by etching the first buffer layer by a certain thickness or the second buffer layer subsequently. By forming the first buffer layer 200 and the second buffer layer 300, the lattice constant mismatch between adjacent layers may be further reduced. Thus, defects due to the lattice constant mismatch may be reduced.

Figure 7:
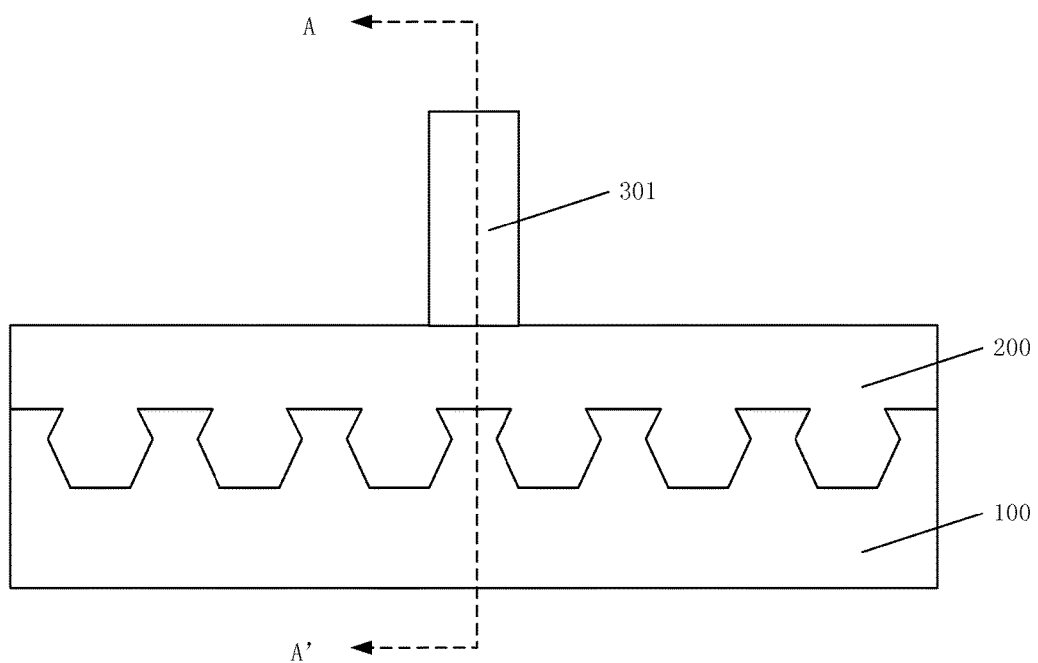
Figure 8:
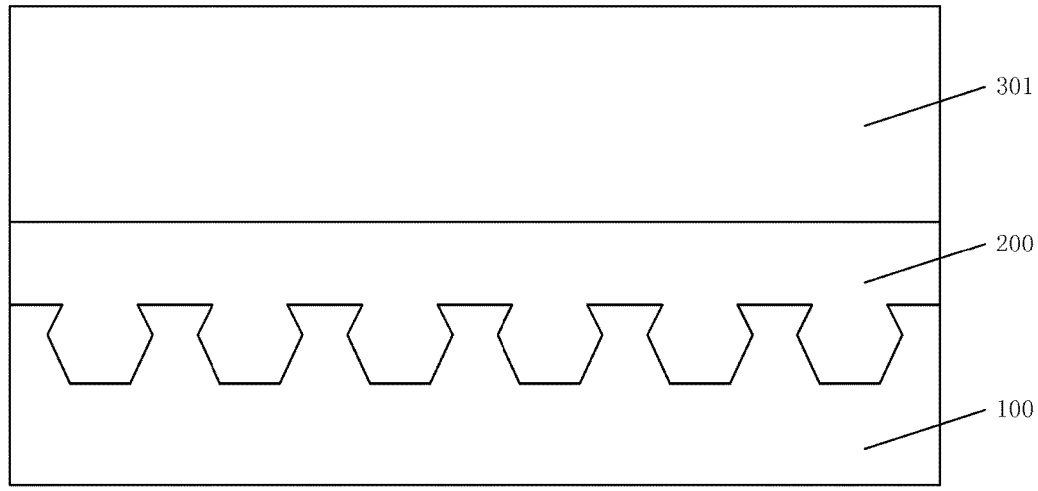

Returning to FIG. 21, a fin body is formed by etching the second buffer layer (S107). FIG. 7 illustrates structures of an exemplary FinFET corresponding to certain stages of the fabrication process consistent with the disclosed embodiments. FIG. 8 illustrates the A-A' sectional view of FIG. 7.

As shown in FIGS. 7-8, a fin body 301 is formed by etching the second buffer layer 300 (FIG. 6) using the first buffer layer 200 as a stop layer.

More specifically, the process for forming the fin body 301 may include forming a patterned mask layer on the second buffer layer 300, wherein the patterned mask layer may define the location and size of the to-be-formed fin body; etching the second buffer layer 300 using the patterned mask layer as a mask to form the fin body 301; and removing the patterned mask layer after forming the fin body 301.

Figure 9:
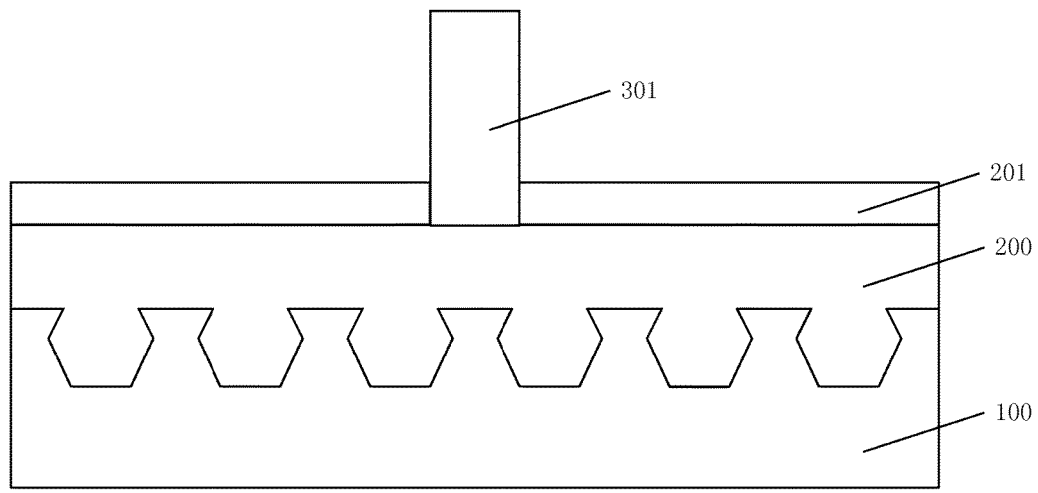

Returning to FIG. 21, an insulation layer is formed on the first buffer layer (S108). FIG. 9 illustrates structures of an exemplary FinFET corresponding to certain stages of the fabrication process consistent with the disclosed embodiments As shown in FIG. 9, an insulation layer 201 is formed on the first buffer layer 200. The top surface of the insulation layer 201 may be below the top surface of the fin body 301.

More specifically, the insulation layer 201 may be made of dielectric materials including silicon oxide, silicon oxynitride, silicon oxycarbide, etc. The thickness of the insulation layer 201 may range from 10 angstroms to 500 angstroms. Further, the top surface of the insulation layer 201 may be below the top surface of the fin body 301.

In one embodiment, the insulation layer 201 is formed by performed an oxidation process to the first buffer layer 200. And, the insulation layer 201 is made of the silicon oxide. The oxidation process may be a thermal oxidation process or a wet oxidation process. Because the material of the second buffer layer 200 may be hard to be oxidized, the insulation layer 201 may only be formed on the surface of the first buffer layer 200. The top surface of the insulation layer 201 may be below the top surface of the fin body 201. The above oxidation process for forming the insulation layer 201 may be simple, saving production cost.

In other embodiments, an insulation material layer may be formed on the first buffer layer 200 using a deposition process. The insulation material layer may cover the surface FinFET. Then, the insulation material layer may be planarized using the top surface of the fin body as a stop layer. Next, an etching back process may be performed to the planarized insulation material layer to lower the surface of the insulation material layer to below the top surface of the fin body, forming the insulation layer 201.

Further, the insulation layer 201 may work as insulation structures between a subsequently formed gate structure and the first buffer layer 200.

Figure 10:
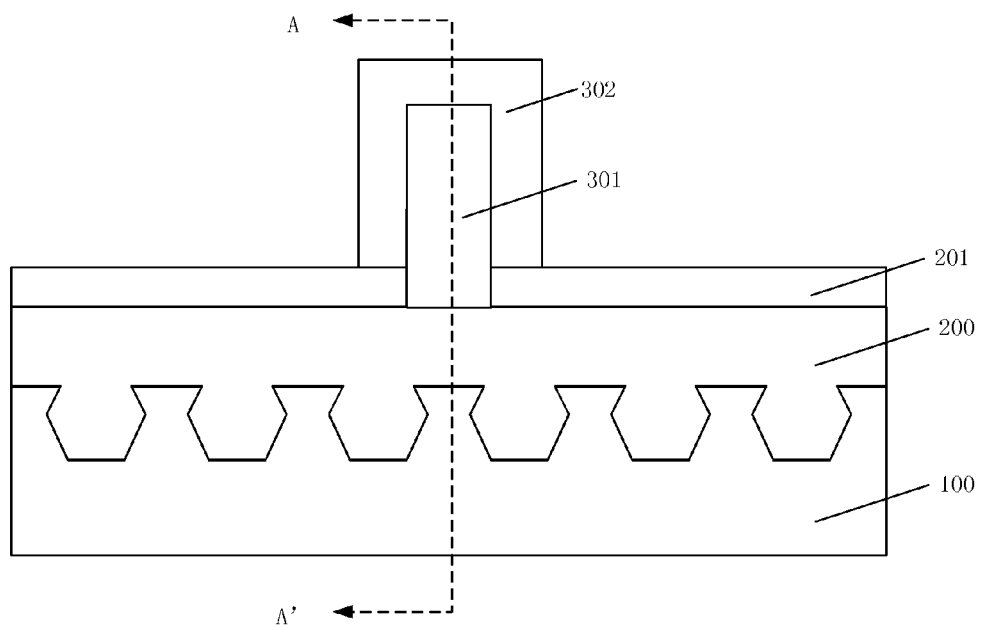

Returning to FIG. 21, a channel layer is formed on the fin body (S109). FIG. 10 illustrates structures of an exemplary FinFET corresponding to certain stages of the fabrication process consistent with the disclosed embodiments. And, FIG. 11 illustrates the A-A' sectional view of FIG. 10.

Figure 11:
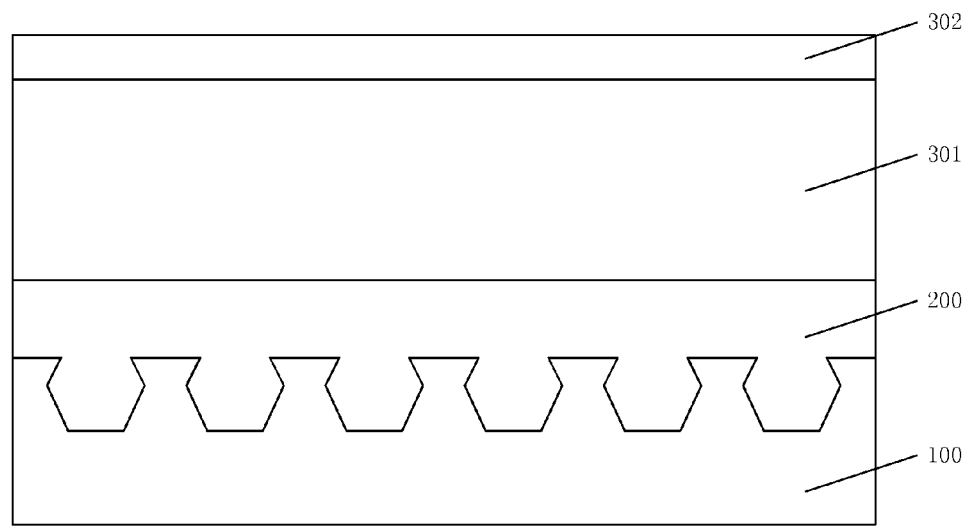

As shown in FIGS. 10-11, a channel layer 302 is formed on the surface of fin body 301.

More specifically, the channel layer 302 may be made of semiconductor materials have high carrier (e.g. electrons and/or holes) mobility, such as the group III-V semiconductor materials. If the to-be-formed FinFET is N-type, the channel layer may be made of semiconductor materials have high electron mobility, including Indium gallium arsenide or indium gallium tellurium compound. If the to-be-formed FinFET is P-type, the channel layer may be made of semiconductor materials have high hole mobility, including gallium telluride compound, etc.

In one embodiment, the to-be-formed FinFET is N-type, and the channel layer is made of Indium gallium arsenide compound. The Indium gallium arsenide compound may have relatively high electron mobility. Thus the formed FinFET may have improved performance, such as on/off speed.

Further, by using a selective epitaxy process, the channel layer 302 may be formed only on the surface of the FinFET, not on the surface of the insulation layer 201. The selective epitaxy process may be a metal oxide chemical vapor deposition process, an atomic layer deposition process, or a molecular beam epitaxy process, etc. The thickness of the channel layer 302 may range from 10 nm to 100 nm.

Because the channel layer 302 may have a lattice constant more closer to the fin body 301, the defects in the channel layer 302 formed on the surface of the fin body 301 by the epitaxy process may be few. That is, the channel layer 302 may have desired quality. Thus, the finally formed FinFET may have improved performance. In addition, after forming trenches in the semiconductor substrate 100, the first buffer layer 200 may be formed by filling the trenches and covering the semiconductor substrate 100. The first buffer layer 200 may have reduced defects on the surface. Thus, when forming the second buffer layer 300 on the surface of the first buffer layer 200 subsequently, defects in the third buffer layer 300 may be reduced. The third buffer layer 300 may have improved quality. And, the fin body 301 formed by etching the second buffer layer 300 may also have reduced defects. Thus, the quality of the channel layer 302 formed on the surface of the fin body 301 may be further improved.

Figure 12:
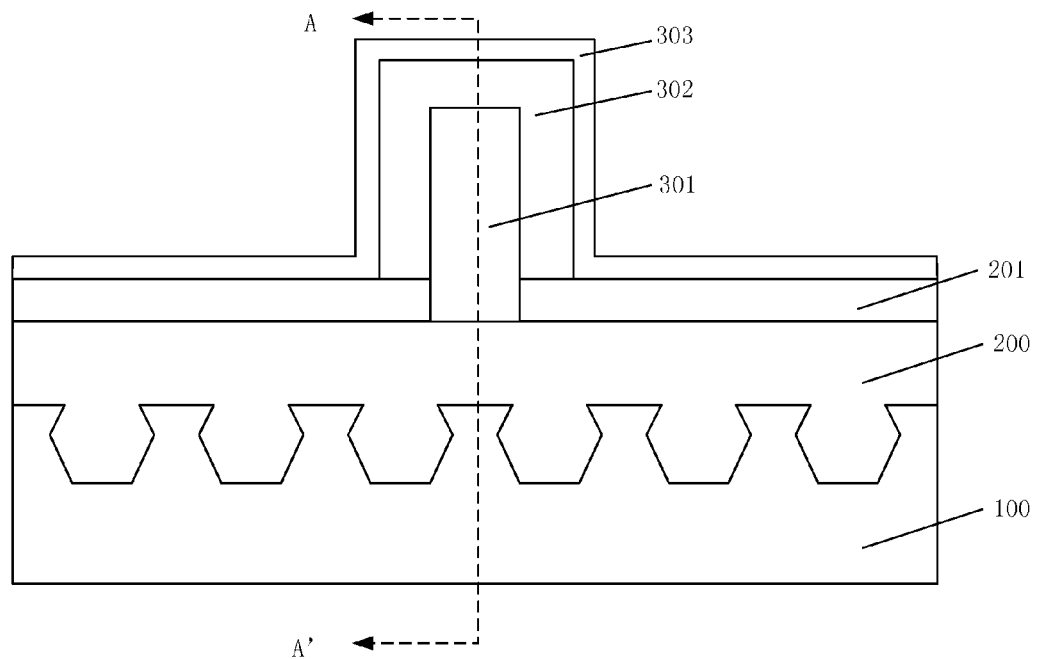
Figure 13:
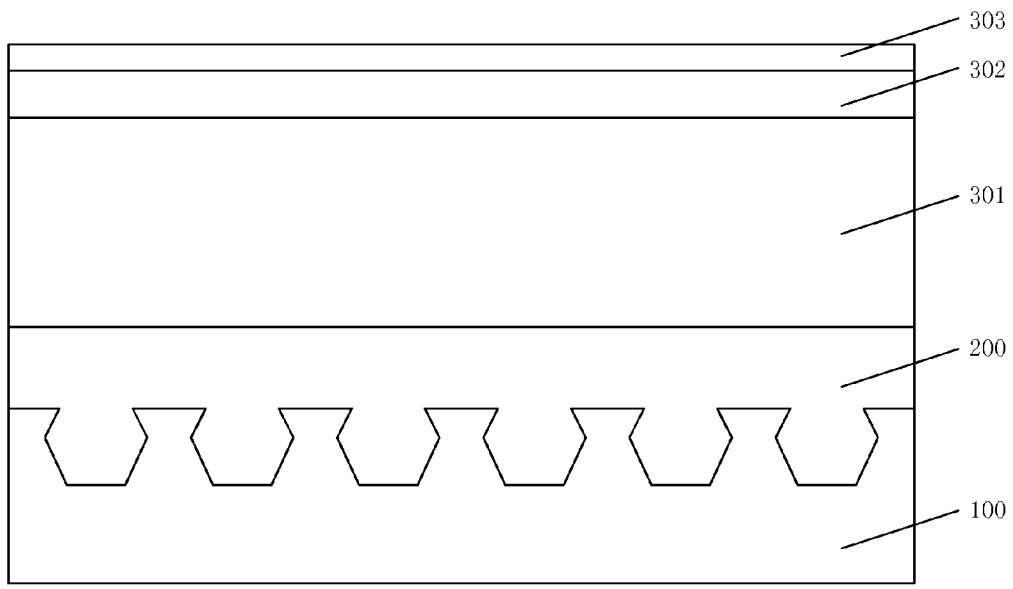

Returning to FIG. 21, a gate dielectric material layer is formed on the channel layer and on the insulation layer (S110). FIG. 12 illustrates structures of an exemplary FinFET corresponding to certain stages of the fabrication process consistent with the disclosed embodiments. FIG. 13 illustrates the A-A' sectional view of FIG. 12.

As shown in FIGS. 12-13, a gate dielectric material layer 303 is formed on the channel layer 302 and on the insulation layer 201.

More specifically, the gate dielectric material layer 303 may be made of certain high κ dielectric materials, such as aluminum oxide, hafnium oxide, zirconium oxide, hafnium silicon oxide, aluminum silicon hafnium oxide, silicon zirconium oxide, silicon titanium dioxide, or a combination thereof. The thickness of the gate dielectric material layer 303 may range from 1 nm to 5 nm. Further, the gate dielectric material layer 303 may be formed by a process including metal oxide chemical vapor deposition, atomic layer deposition, and/or plasma enhanced chemical vapor deposition.

Figure 14:
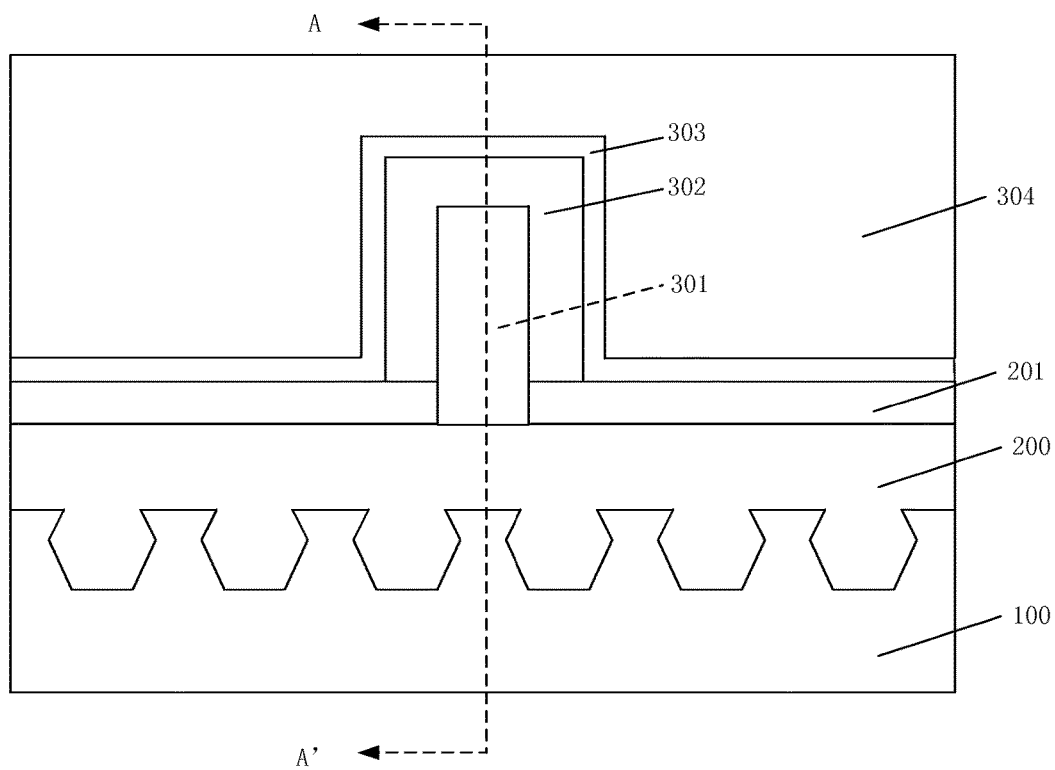
Figure 15:
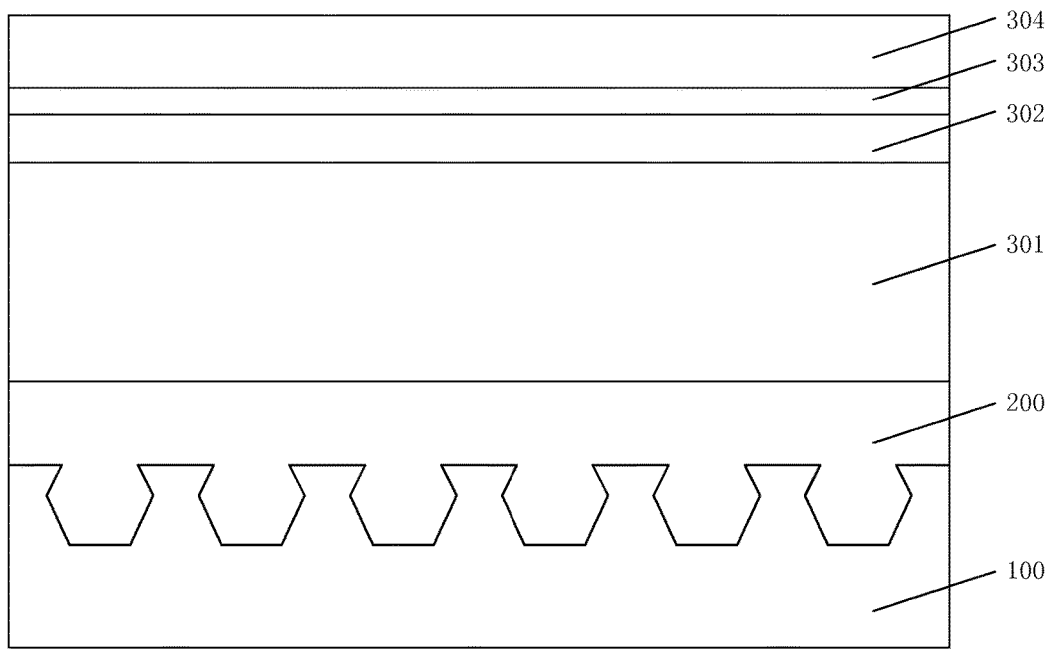

Returning to FIG. 21, a gate material layer is formed on the gate dielectric material layer (S111). FIG. 14 illustrates structures of an exemplary FinFET corresponding to certain stages of the fabrication process consistent with the disclosed embodiments. FIG. 15 illustrates the A-A' sectional view of FIG. 14.

As shown in FIGS. 14-15, a gate material layer 304 is formed on the gate dielectric material layer 303.

More specifically, the gate material layer 304 may be made of NiAu, CrAu, Al, Cu, Au, Pt, Ni, Ti, TiN, TaN, or a combination thereof. The process for forming the gate material layer 304 may include physical vapor deposition, metal oxide chemical vapor deposition, atomic layer deposition, and/or molecular beam epitaxy.

Figure 16:
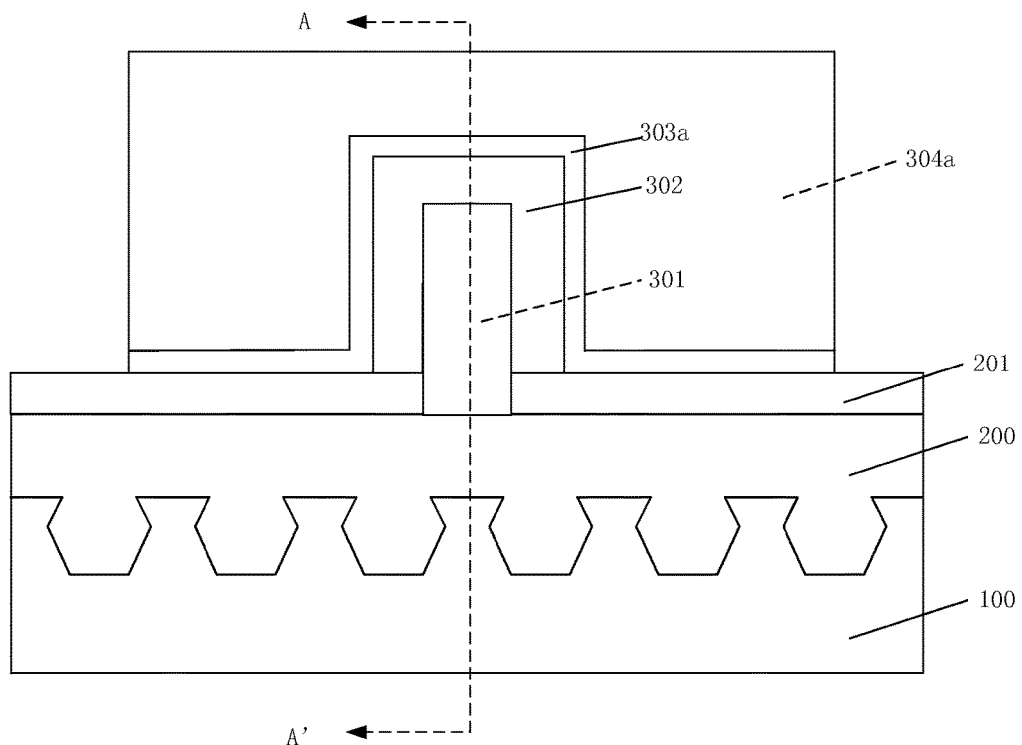
Figure 17:
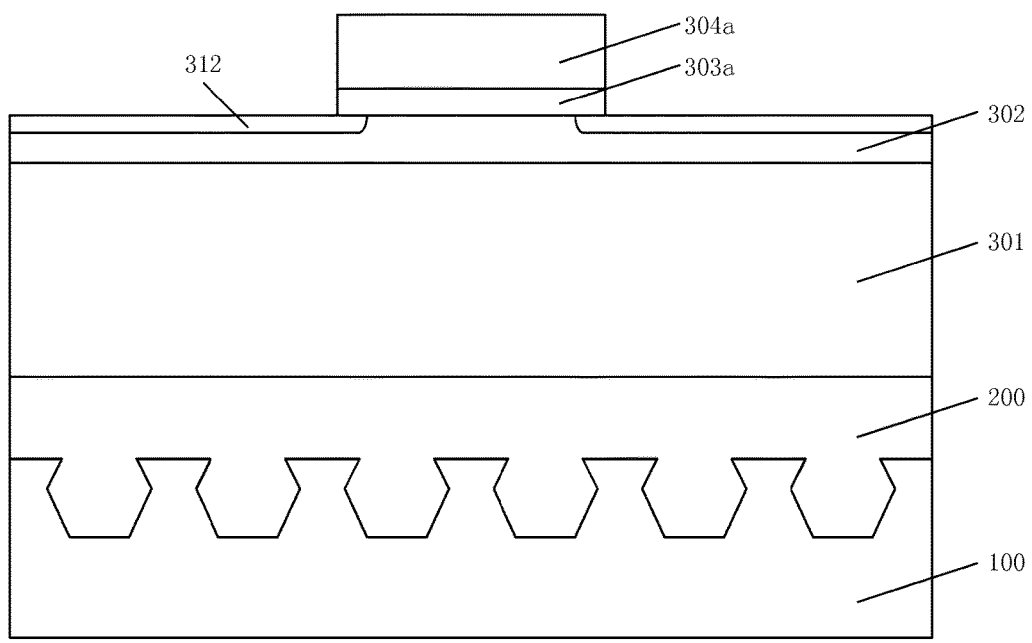

Returning to FIG. 21, a gate structure and one or more lightly doped region are formed (S112). FIG. 16 illustrates structures of an exemplary FinFET corresponding to certain stages of the fabrication process consistent with the disclosed embodiments. FIG. 17 illustrates the A-A' sectional view of the FIG. 16.

As shown in FIGS. 16-17, a gate structure including a gate dielectric layer 303a and gate layer 304a is formed on/across the fin body 301 by patterning the gate material layer 304 (FIG. 14) and the gate dielectric material layer 303 (FIG. 14). Further, a light iron implantation process may be performed to the channel layer 302 located on the two sides of the gate structure to form one or more lightly doped region 312.

More specifically, the process for forming the gate structure may include forming a patterned mask layer on the gate material layer 304 to define the size and position of the to-be-formed gate structure; dry etching the gate material layer and gate dielectric material layer using the patterned mask layer as a mask to form the gate layer 304a and the gate dielectric layer 303a. Further, after forming the gate structure, a light iron implantation process may be performed to the channel layer 302 located on the two sides of the gate structure to form the lightly doped region 312.

In one embodiment, the to-be-formed FinFET is N-type. Thus, the light iron implantation process may use N-type irons, including P, As, Sb, or a combination thereof. In other embodiments, the to-be-formed FinFET is P-type. Thus, the light iron implantation process may use certain P-type irons.

Figure 18:
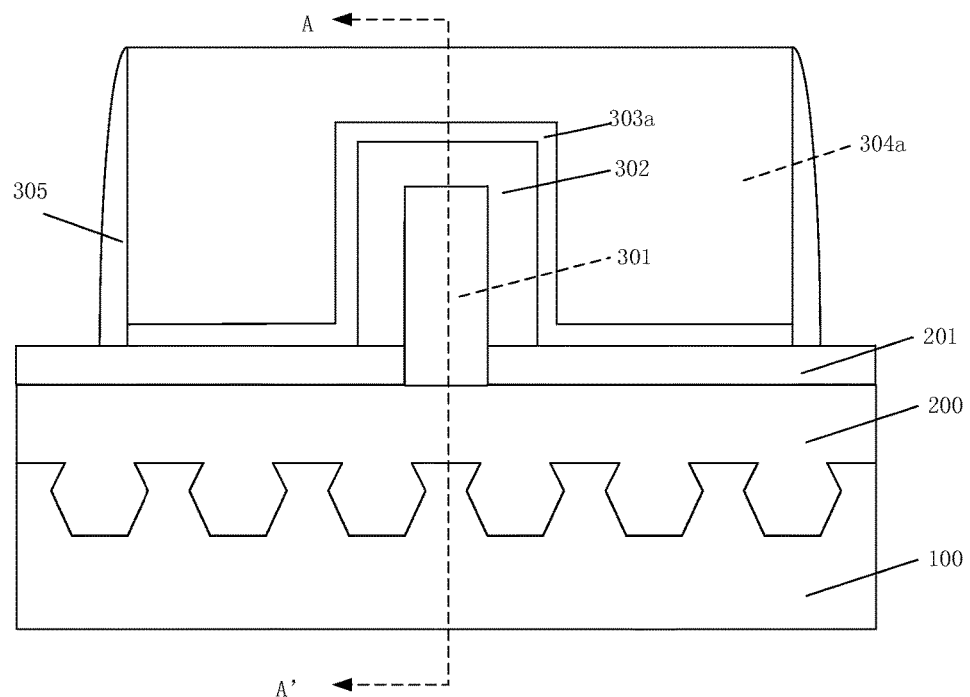
Figure 19:
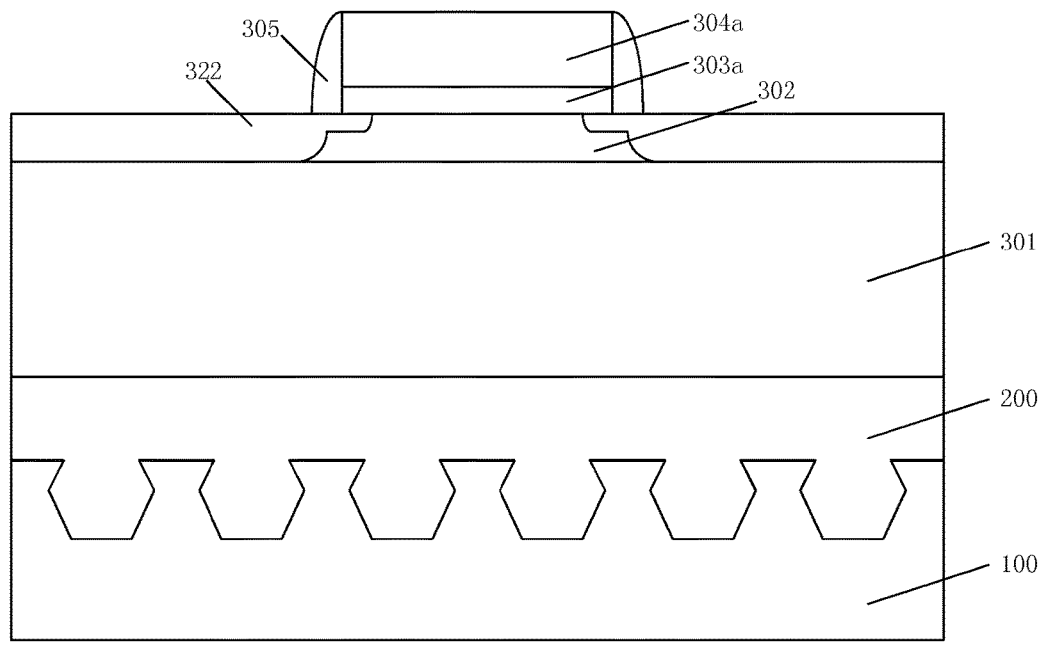

Returning to FIG. 21, a spacer layer and one or more source/drain region are formed (S113). FIG. 18 illustrates structures of an exemplary FinFET corresponding to certain stages of the fabrication process consistent with the disclosed embodiments. FIG. 19 illustrates the A-A' sectional view of the FIG. 18.

As shown in FIGS. 18-19, a spacer layer 305 is formed to cover sidewalls of the gate layer 304a and the gate dielectric layer 303a. Then, one or more source/drain region 322 may be formed by performing a heavy iron implantation process and an annealing process to the channel layer 302 located on the two sides of the gate structure. The annealing process may active the doped irons.

More specifically, the spacer layer 305 may be made of dielectric materials such as silicon nitride, silicon oxide, and/or silicon oxynitride, etc. The heavy iron implantation process may use the same type of doping irons as used in the light iron implantation process.

Returning to FIG. 21, a metal electrode layer is formed on the surface of the source/drain region (S114). FIG. 20 illustrates structures of an exemplary FinFET corresponding to certain stages of the fabrication process consistent with the disclosed embodiments.

As shown in FIG. 20, a metal electrode layer 306 is formed on the surface of the source/drain region 322.

More specifically, the metal electrode layer 306 may be made of any proper conducting materials, including NiAu or CrAu. The metal electrode layer 306 may be made by a physical vapor deposition process, such as sputtering or thermal evaporating. The metal electrode layer 306 may be able to reduce the contact resistant at the source/drain region 322.

Accordingly, the present disclosure provides a FinFET that may be formed by the above illustrated fabrication method.

As shown in FIG. 18 and FIG. 20, an FinFET consistent with the present disclosure may include a semiconductor substrate 100 having one or more trench; a first buffer layer 200 located on the semiconductor substrate 100, wherein the first buffer layer 200 may fill the trench and may cover the surface of the semiconductor substrate 100; a fin body 301 located on the first buffer layer 200; and an isolation layer 201 located on the first buffer layer 200 around the fin body 301, wherein the top surface of the insulation layer 201 may be below the top surface of the fin body 301.

The FinFET may further include a channel layer 302 located on the surface of the fin body 301; a gate structure including a gate dielectric layer 303a and a gate layer 304a on the gate dielectric layer, wherein the gate structure is formed across the fin body 301 and on portion surface of the insulation layer 201 and the channel layer 302; one or more source/drain region 322 located in the channel layer 302 on the two sides of the gate structure.

Moreover, the top width of the trench may range from 5 nm to 500 nm, the distance between two adjacent trenches may range from 10 nm to 1000 nm, and the depth of the trench may ranging from 8 nm to 1000 nm.

In addition, the first buffer layer 200 and the fin body 301 may be made of semiconductor materials. The lattice constants of the semiconductor substrate 100, the first buffer layer 200, the fin body 301, and the channel layer 302 may increase gradually or decrease gradually.

In one embodiment, the first buffer layer 200 may be made of silicon germanium, and the fin body may be made of indium aluminum arsenide compound or indium phosphide.

Further, the channel layer 302 may have a thickness ranging from 1 nm to 10 nm, and the channel layer 302 may be made of indium gallium arsenide, indium gallium telluride, or gallium telluride.

In the disclosed FinFET, the first buffer layer 200 may have relative fewer defects. Thus, the fin body 301 formed on the first buffer layer 200 may have relatively fewer defects, and the channel layer formed on the fin body 301 may also have relatively fewer defects. The carriers in the channel layer 302 may have improved motilities. Therefore, the finally formed FinFET may have improved performance.

Thus, by using the buffer layer, the fin body formed on the buffer layer may have fewer defects, the channel layer formed on the fin body may have fewer defects, carriers in the channel layer may have improved nobilities, and the finally formed FinFET may have improved performance.

Embodiments consistent with the current disclosure provide a FinFET and a fabrication method thereof. Other applications, advantages, alternations, modifications, or equivalents to the disclosed embodiments are obvious to those skilled in the art. It is intended that the specification and examples be considered as exemplary only, with a true scope and spirit of the invention being indicated by the claims.

What is claimed is:
1. A FinFET, comprising:
   a semiconductor substrate having one or more trenches;
   a buffer layer having:
      a first portion filling in the one or more trenches within the semiconductor substrate,
      a second portion covering a surface of the semiconductor substrate, and
      a fin body protruding from the second portion of the buffer layer;
   a channel layer enveloping the fin body of the buffer layer;

a gate structure formed across a length portion of the channel layer on the fin body; and
a source region and a drain region located in the channel layer on two sides of the gate structure.

2. The FinFET according to claim 1, wherein:
a top width of the one or more trenches ranges from 5 nm to 500 nm;
a distance between adjacent trenches ranges from 10 nm to 1000 nm; and
a depth of the one or more trenches ranges from 8 nm to 1000 nm.

3. The FinFET according to claim 1, wherein the buffer layer further includes:
a first buffer layer including the first portion filling the one or more trenches and the second portion covering the surface of the semiconductor substrate; and
a second buffer layer formed on the first buffer layer and including the fin body.

4. The FinFET according to claim 3, wherein:
the first buffer layer is made of silicon germanium;
the second buffer layer is made of indium aluminum arsenide compound or indium phosphide; and
the channel layer is made of indium gallium arsenide, indium gallium telluride or gallium telluride.

5. The FinFET according to claim 3, wherein:
the first buffer layer has a thickness ranging from 10 nm to 500 nm; and
the second buffer layer has a thickness ranging from 10 nm to 500 nm.

6. The FinFET according to claim 3, wherein:
the fin body is formed by etching the second buffer layer using the first buffer layer as an etch stop layer.

7. The FinFET according to claim 1, wherein:
the one or more trenches have Σ shaped sidewalls.

8. The FinFET according to claim 1, wherein:
the semiconductor substrate is made of a material comprising silicon, germanium, gallium arsenidie, silicon germanium, carborundum, indium antimonide, lead telluride, indium arsenide, indium phosphide, gallium antimonite, alloy semiconductor, silicon on insulator, germanium on insulator, silicon oxide, silicon nitride, silicon oxynitride, silicon carbonitride, or a combination thereof.

9. The FinFET according to claim 1, further including:
an insulation layer located on a surface of the second portion of the buffer layer around the fin body of the buffer layer, having a top surface lower than a top surface of the fin body, wherein:
a portion of the channel layer is on the insulation layer.

10. The FinFET according to claim 1, wherein:
the insulation layer is an oxidation layer oxidized from the second portion of the buffer layer covering the surface of the semiconductor substrate; and
the insulation layer has a thickness ranging from 10 angstroms to 500 angstroms.

11. The FinFET according to claim 1, further including:
an electrode layer located on a surface of the source region and the drain region.

12. The FinFET according to claim 1, further including:
the fin body of the buffer layer has a width less than the second portion of the buffer layer.

13. A FinFET, comprising:
a semiconductor substrate having one or more trenches;
a buffer layer located on the semiconductor substrate filling the one or more trenches and covering a surface of the semiconductor substrate;
a fin body formed by etching the buffer layer by a certain thickness, wherein the fin body is on a remaining buffer layer;
an insulation layer located on the remaining buffer layer around the fin body, having a top surface lower than a top surface of the fin body;
a channel layer located on a surface of the fin body and on the insulation layer, wherein: the buffer layer and the fin body are made of semiconductor materials, and lattice constants of the semiconductor substrate, the buffer layer, and the channel layer increase gradually;
a gate structure formed across the fin body located on portion surface of the insulation layer and the channel layer;
a source region and a drain region located in the channel layer on two sides of the gate structure; and
an electrode layer located on a surface of the source region and the drain region.

14. The FinFET according to claim 13, wherein:
a top width of the one or more trenches ranges from 5 nm to 500 nm;
a distance between adjacent trenches ranges from 10 nm to 1000 nm; and
a depth of the one or more trenches ranges from 8 nm to 1000 nm.

15. The FinFET according to claim 13, wherein the buffer layer further includes:
a first buffer layer filling the one or more trenches and covering the surface of the semiconductor substrate; and
a second buffer layer formed on the first buffer layer.

16. The FinFET according to claim 15, wherein:
the first buffer layer has a thickness ranging from 10 nm to 500 nm; and
the second buffer layer has a thickness ranging from 10 nm to 500 nm.

17. The FinFET according to claim 15, wherein:
the first buffer layer is made of silicon germanium;
the second buffer layer is made of indium aluminum arsenide compound or indium phosphide;
the fin body is made of indium aluminum arsenide compound or indium phosphide; and
the channel layer is made of indium gallium arsenide, indium gallium telluride or gallium telluride.

18. A FinFET, comprising:
a semiconductor substrate having one or more trenches;
a buffer layer located on the semiconductor substrate filling the one or more trenches and covering a surface of the semiconductor substrate;
a fin body formed by etching the buffer layer by a certain thickness, wherein the fin body is on a remaining buffer layer;
an insulation layer located on the remaining buffer layer around the fin body, having a top surface lower than a top surface of the fin body;
a channel layer located on a surface of the fin body and on the insulation layer, wherein: the channel layer has a thickness ranging from 1 nm to 10 nm; and the channel layer is made of indium gallium arsenide, indium gallium telluride, or gallium telluride;
a gate structure formed across the fin body located on portion surface of the insulation layer and the channel layer;
a source region and a drain region located in the channel layer on two sides of the gate structure; and
an electrode layer located on a surface of the source region and the drain region.

19. The FinFET according to claim 18, wherein the buffer layer further includes:
- a first buffer layer filling the one or more trenches and covering the surface of the semiconductor substrate; and
- a second buffer layer formed on the first buffer layer and including the fin body.

20. The FinFET according to claim 18, wherein:
- the insulation layer is an oxidation layer oxidized from a portion of the buffer layer covering the surface of the semiconductor substrate; and
- the insulation layer has a thickness ranging from 10 angstroms to 500 angstroms.

\* \* \* \* \*